US011177822B2

(12) United States Patent
Singh et al.

(10) Patent No.: US 11,177,822 B2
(45) Date of Patent: Nov. 16, 2021

(54) SYSTEM AND METHOD FOR BACKGROUND CALIBRATION OF TIME INTERLEAVED ADC

(71) Applicant: VERVESEMI MICROELECTRONICS PRIVATE LIMITED, Greater Noida (IN)

(72) Inventors: Pratap Narayan Singh, Greater Noida (IN); Ashish Kumar Sharma, Greater Noida (IN); Chinmaya Dash, Greater Noida (IN)

(73) Assignee: VERVESEMI MICROELECTRONICS PRIVATE LIMITED, Greater Noida (IN)

( * ) Notice: Subject to any disclaimer, the term of this patent is extended or adjusted under 35 U.S.C. 154(b) by 0 days.

(21) Appl. No.: 17/105,366

(22) Filed: Nov. 25, 2020

(65) Prior Publication Data
US 2021/0159908 A1 May 27, 2021

(30) Foreign Application Priority Data

Nov. 27, 2019 (IN) .............................. 201911048486

(51) Int. Cl.
H03M 1/10 (2006.01)
H03M 1/06 (2006.01)
(Continued)

(52) U.S. Cl.
CPC ....... H03M 1/1033 (2013.01); H03M 1/0624 (2013.01); H03M 1/0626 (2013.01); H03M 1/0836 (2013.01); H03M 1/1215 (2013.01)

(58) Field of Classification Search
CPC ............. H03M 1/1033; H03M 1/0604; H03M 1/0624; H03M 1/121; H03M 1/1215
(Continued)

(56) References Cited

U.S. PATENT DOCUMENTS 6,121,799 A * 9/2000 Moser ....................... G06J 1/00
327/58
8,519,875 B2 8/2013 Straayer et al.
(Continued)

Primary Examiner — Khai M Nguyen
(74) Attorney, Agent, or Firm — Maschoff Brennan

(57) ABSTRACT

The present invention discloses a method of calibrating time interleaved analog to digital converter comprising: sampling a common input signal, said sampling is performed by an array of sub analog to digital converters, each generating individual digital analog equivalent outputs with sampling time errors, said digital outputs are fed to sampling time error estimation circuitry to calculate a digital output proportional to sampling time error between two consecutive channels, without any restriction on input signal or ADC channel design, said timing skew estimator circuitry composed of generating a delayed output of one of the two consecutive ADC channels, channel first and channel second and subtracting the said delayed output with digital output of the said second channel and producing the first subtracted output and output of said second channel subtracted with said first channel output delayed by sampling delay between the two consecutive channels and producing the second subtracted delayed output, absolute value of the said first subtracted output and said second subtracted delayed output is monitored for peak value of both for a fixed time duration and then subtracted values of the said peak values are the estimation of sampling time error between the said two consecutive channels, same process is repeated to each consecutive ADC channels of the said ADC array.

6 Claims, 5 Drawing Sheets

Interleaved ADC Skew Calibration implementation

(51) Int. Cl.
*H03M 1/08* (2006.01)
*H03M 1/12* (2006.01)

(58) Field of Classification Search
USPC .................................................. 341/118, 155
See application file for complete search history.

(56) References Cited

U.S. PATENT DOCUMENTS

| | | | |
|---|---|---|---|
| 8,604,952 B2 * | 12/2013 | Kidambi | H03M 1/0604 |
| | | | 341/118 |
| 8,890,729 B2 | 11/2014 | Lewis et al. | |
| 8,957,798 B1 | 2/2015 | Harris | |
| 9,270,291 B1 | 2/2016 | Parnaby et al. | |
| 9,287,889 B2 | 3/2016 | Chiu et al. | |
| 9,503,116 B2 | 11/2016 | Speir et al. | |
| 9,608,652 B2 | 3/2017 | Lee et al. | |
| 2017/0117914 A1 | 4/2017 | Choi | |

\* cited by examiner

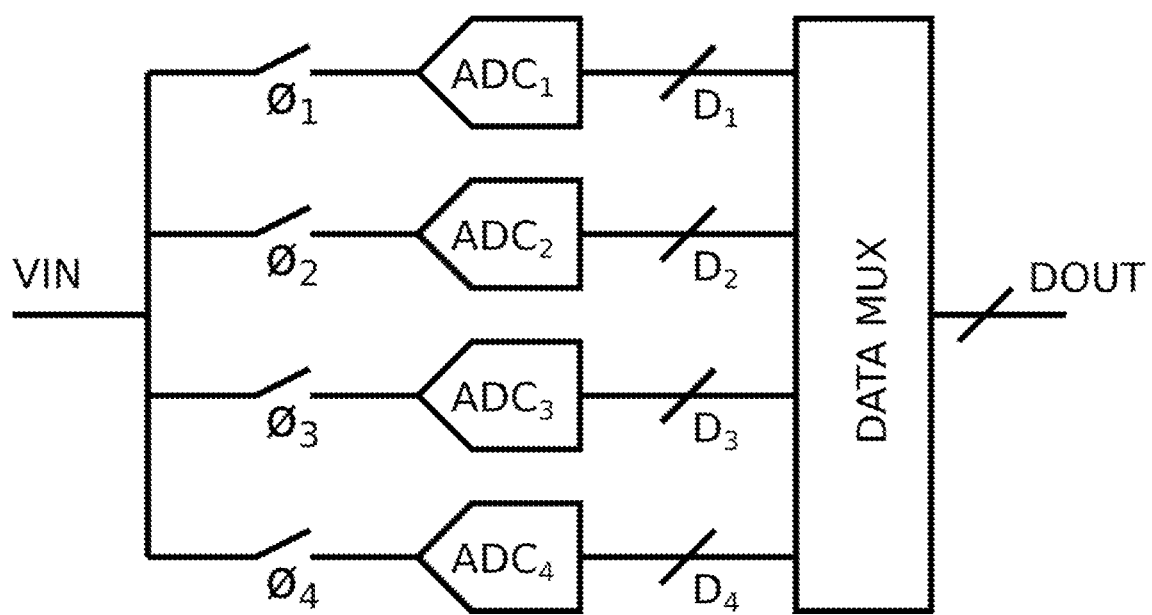
FIG 1: Time Interleaved ADC
--Prior Art--

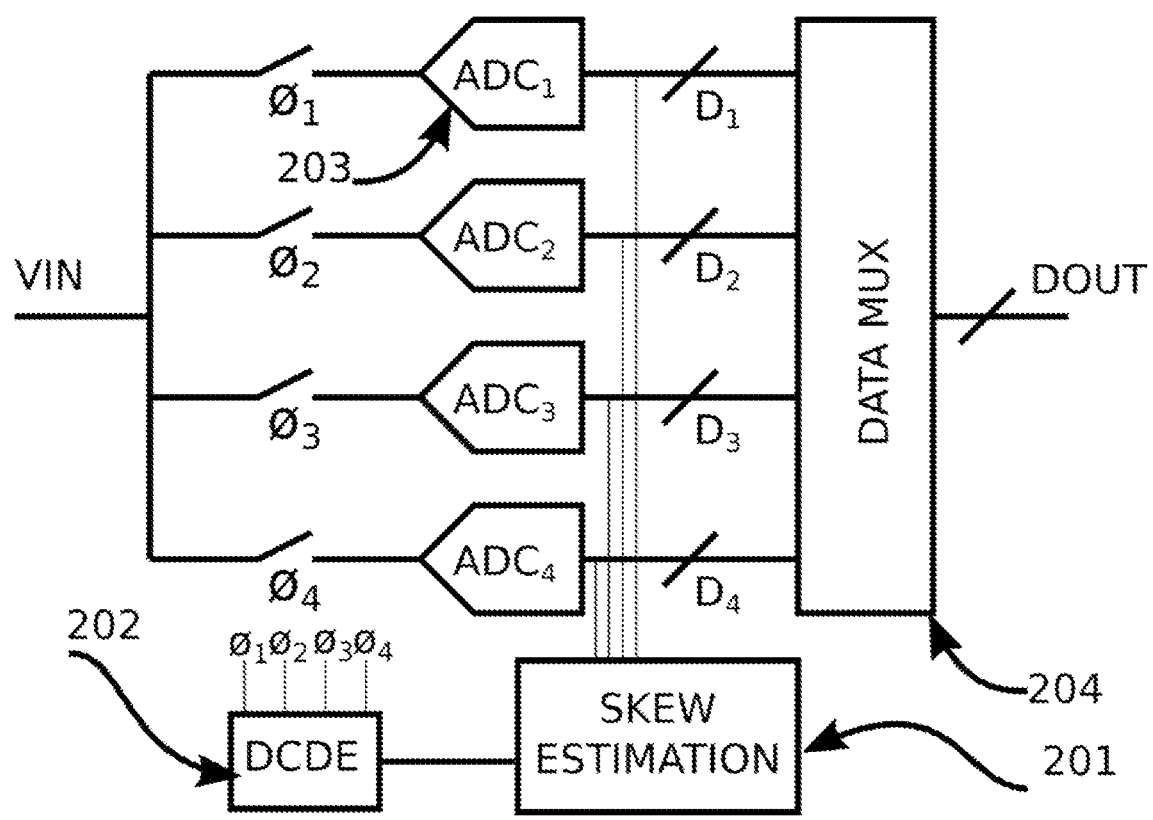
FIG 2: Skew Calibrated Interleaved ADC
--Prior Art--

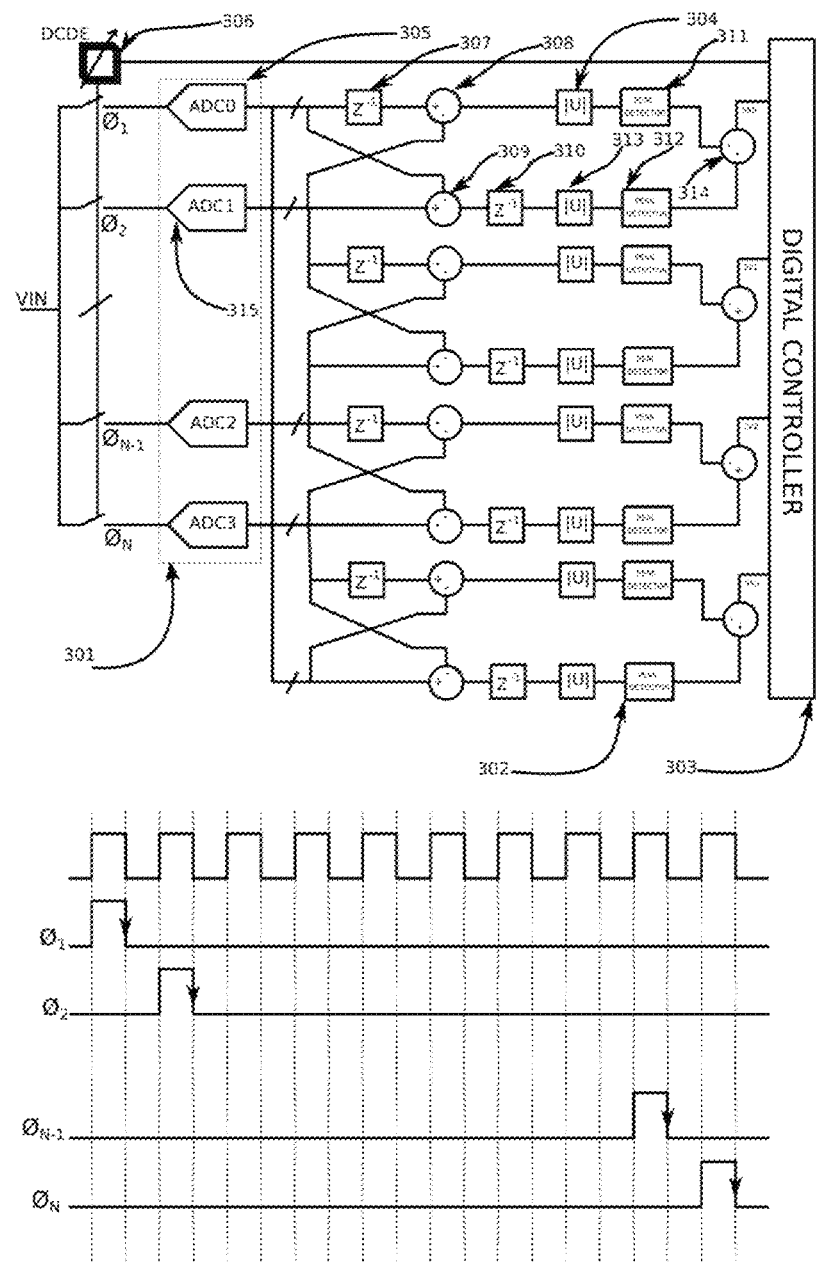
FIG 3: Interleaved ADC Skew Calibration implementation

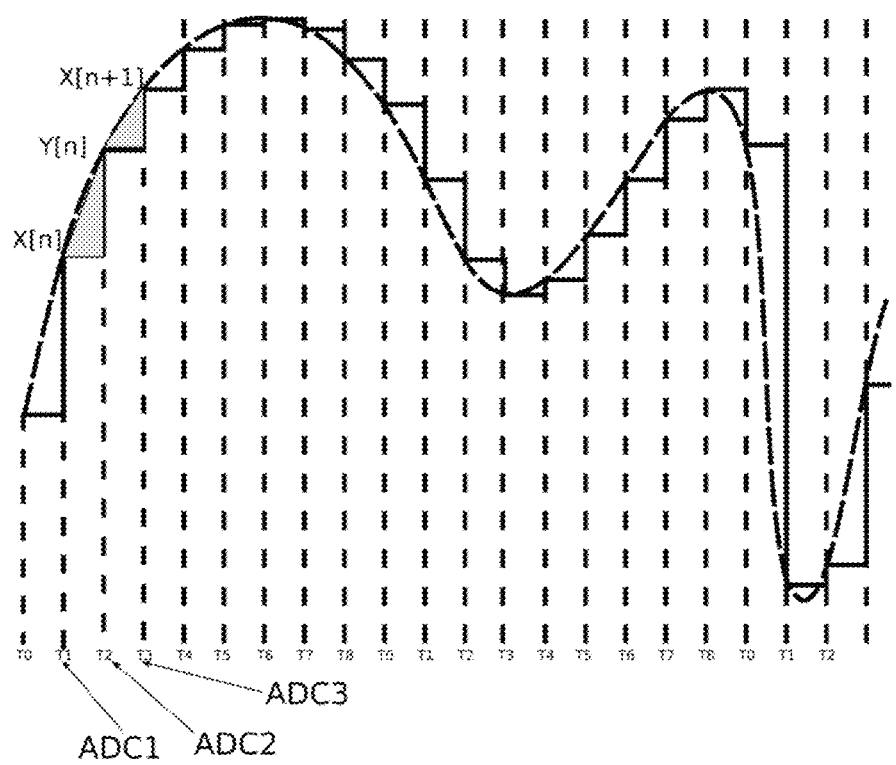
FIG 4: SKEW Estimation Algorithm

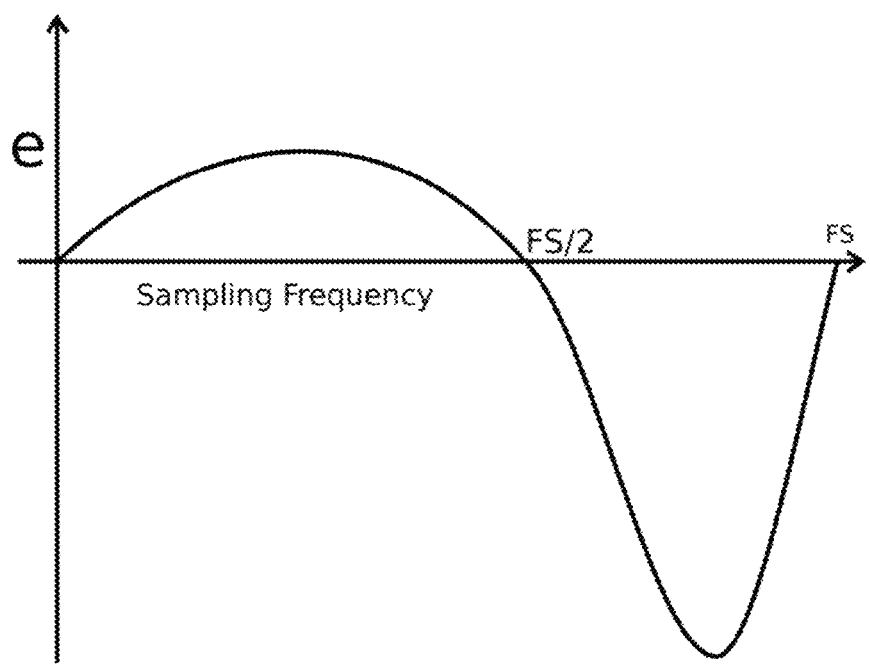
FIG 5: SKEW Transfer Function with Input Frequency

SYSTEM AND METHOD FOR BACKGROUND CALIBRATION OF TIME INTERLEAVED ADC

FIELD OF INVENTION

Present invention relates to the field of analog to digital conversion.

Specifically, it relates to time interleaved converters with sampling time error, background calibration of the errors and improvement in high frequency linearity of the analog to digital converter system without application of any specialized input signal.

BACKGROUND OF INVENTION

Time interleaved ADCs are used to improve sampling speed of the combined ADC but interleaving process required different clocks with pre specified phase relation between individual clocks of each ADC channel. If one ADC is running at sampling rate of Fs and there are N channels to be interleaved then overall converter sampling speed because sampling process is Fs×N and outputs are aligned and multiplexed to generate data output at the speed of Fs×N. FIG. 1 depicts the time interleaved ADC configuration. The phase difference between clock phases is called inter channel skew, which can impact the linearity of the acquired data. There are other errors associated with interleaving and they are normally referred as Gain error, Offset mismatch and Bandwidth mismatch along with timing skew.

There are many prior arts developed to address the calibration of interleaving error related issues and they can be divided into two major categories named foreground and background, foreground calibration needs the conversion operation to be interrupted and continued again after calibration of the errors, while background calibration doesn't need to interrupt the conversion operation but to keep adjusting the errors in the background. Both type of techniques requires either some kind redundancy in terms of number of channels like U.S. Pat. No. 9,608,652 using coarse ADC, and U.S. Pat. No. 8,957,798 using derivative filter to estimate error or injection of some kind of deterministic signal in the conversion path. U.S. Pat. No. 9,287,889 discloses a method employing background calibration techniques for identifying and correcting mismatch errors in time interleaved ADC specifically removing the timing skew and input bandwidth mismatch but it needs an extra channel with delayed input to assist the error estimation. After estimation of the errors the correction is mostly performed in two ways either allying the correction on the data and sending it to the output (blind calibration) or sending some feedback to correct the errors as shown in FIG. 2. Blind calibration and redundancy type feedback loop requires the extra hardware and it results in more silicon area, power consumption and complexity. This kind of prior arts use complicated filtering to extract the skew error information and multipliers U.S. Pat. No. 9,270,291 used are significantly costing power and area.

OBJECTS OF INVENTION

Principal object of this invention is to calibrate the errors caused by the timing mismatch of the time interleaved ADCs using minimal analog hardware feedback loop and without application any extra component in signal path.

Another objective of the present invention is to achieve the improved dynamic performance of the analog to digital converter by correcting the timing mismatch errors.

Yet another objective of the present invention is to reduce design complexity and also reduce silicon area required in the design.

SUMMARY OF THE INVENTION

The present invention discloses a system and method for background calibration of time interleaved ADC comprising: sampling a common input signal, said sampling is performed by an array of sub analog to digital converters, each generating individual digital analog equivalent outputs with sampling time errors, said digital outputs are fed to sampling time error estimation circuitry to calculate a digital output proportional to sampling time error between two consecutive channels, without any restriction on input signal or ADC channel design, said timing skew estimator circuitry composed of generating a delayed output of one of the two consecutive ADC channels, channel first and channel second and subtracting the said delayed output with digital output of the said second channel and producing the first subtracted output and output of said second channel subtracted with said first channel output delayed by sampling delay between the two consecutive channels and producing the second subtracted delayed output, absolute value of the said first subtracted output and said second subtracted delayed output is monitored for peak value of both for a fixed time duration and then subtracted values of the said peak values are the estimation of sampling time error between the said two consecutive channels, same process is repeated to each consecutive ADC channels of the said ADC array.

In one of the embodiments, the method further comprising a relative error calculator from first ADC channel to last the last ADC channel in the array.

In other embodiment, the method further comprising a feedback to the sampling time generation circuitry in the order to reduce said sampling time errors and process is continued until said timing error is reduced to acceptable range.

In another embodiment, the method further comprising a digitally controlled delay element associated with each ADC channel in the array to modify the sampling time in proportion to the said estimated skew along with sign from the reference sampling point.

In yet another embodiment, the method also comprising the complete estimation calibration operation being performed in background without interrupting the ADC conversion process.

BRIEF DESCRIPTION OF FIGURES

1. FIG. 1 Time Interleaved ADC
2. FIG. 2 Skew Calibrated Interleaved ADC
3. FIG. 3 Interleaved ADC Skew Calibration implementation
4. FIG. 4 SKEW Estimation Algorithm
5. FIG. 5 SKEW Transfer Function with Input Frequency

DETAILED DESCRIPTION OF INVENTION

In the following description, the terms are used to describe on possible implemented but there are different derivative possible using direct, indirect electrical connections or by changing the place and order of the described blocks and components as well as the analog or digital functionally equivalent system blocks and forthcoming details should be interpreted with the meaning of including but not limited to kind of implementation and claims.

The method of calibration and compensation of timing errors in the process of sampling of the applied input signal without having the knowledge and type of the signal using circuits and method shown in the FIG. 3. Where sampled input signal is sampled by sampling $\Phi_1$ to $\Phi_N$ which may or may not have errors, this signal is sampled as shown in FIG. 4 for a two channel interleaved ADC example at any point of time from one sampled channel two consecutive samples are called X[n] and X[n+1] and next channel samples the point Y[n] which should be ideally in the middle of the X[n] and X[n+1] as shown in FIG. 4 if there is no skew error. As it is clear and known to anyone expert in the field of analog design that there could be multiple implementations using samples of only two or three channels for the described samples X[n], X[n+1] and Y[n] and might result in similar transfer functions for skew estimation and pictures are used for one particular implementation as example but it doesn't limit the possibility of other variations. FIG. 5 is showing the transfer function of the equation resulting from the equation used.

$$e=\text{MAX}(\|X[n+1]-Y[n]\|-\|X[n]-Y[n]\|). \tag{1}$$

FIG. 3 is as one embodiment of the present invention describing the system and apparatus of analog to digital converter ADC 301, comprising at least one ADC channel 305 sampling at the rate Fs/N where Fs is the sampling frequency of the system and apparatus 301 and N is the number of channels in the ADC 301 which convert an analog signal VIN to each channel of the ADC. Each channel produces the output sampled data which is coupled to skew estimator 201 as shown in FIG. 2 and digital output multiplexer 204, skew estimator 201 is coupled to either a digitally controlled delay element to change at least one sampling clock of at least one ADC channel 305 to reduce the delay mismatch between ADC channels. The skew estimator in present invention can estimate the skew without needing any specific restriction on the input signals. The embodiment skew estimator 201 is comprised of the plurality of the delay elements to align the channels data which is coupled to the subtractors 308,309 where subtractor 308 is coupled to delayed output of the delay element 307 and output of the next ADC channel 315 and output of the subtractor is coupled with the absolute element 304 and output of the element 304 is connected to a window based peak detector 311. Digital data output of the ADC channel 315 is coupled to subtractor 309 which is coupled to output of the ADC channel 305 and output of the subtractor 309 is coupled to the input of the delay element 310 which is coupled to the input of the absolute element 313 coupled to the input of the peak detector 312, output of the 312 is coupled to positive input of the subtractor 314, whose negative input is coupled to peak detector 311 output. Output of the subtractor 314 is resulting in Skew error difference of the channels. This apparatus can be extended to plurality of the channels of samplers to increase overall sampling of the ADC.

While the invention has been particularly described with references to preferred embodiments thereof, it will be understood by those skilled in the art that various changes may be made therein without departing from the scope of the invention encompassed by the appended claims.

We claim:

1. A method for Background Calibration of Time Interleaved ADC comprising:
sampling a common input signal, said sampling is performed by an array of sub analog to digital converters, each generating individual digital analog equivalent outputs with sampling time errors, said digital analog equivalent outputs are fed to sampling time error estimation circuitry to calculate a digital output proportional to sampling time error between two consecutive channels, without any restriction on input signal or ADC channel design, said sampling time error estimation circuitry composed of generating a delayed output of one of the two consecutive ADC channels, channel first and channel second and subtracting the said delayed output with digital output of the said second channel and producing the first subtracted output and output of said second channel subtracted with said first channel output delayed by sampling delay between the two consecutive channels and producing the second subtracted delayed output, absolute value of the said first subtracted output and said second subtracted delayed output is monitored for peak value of both for a fixed time duration and then subtracted values of the said peak values are the estimation of sampling time error between the said two consecutive channels which is used to change the sampling delay of the ADC channel such that skew error is reduced, wherein the method for background calibration of time interleaved ADC is repeated to each consecutive ADC channels of the said ADC array until the said skew error is below ADC resolution.

2. The method of claim 1/as claimed in claim 1 further comprising a relative error calculator from first ADC channel to last the last ADC channel in the array.

3. The method of claim 1/as claimed in claim 1 further comprising a feedback to the sampling time estimation circuitry in the order to reduce said sampling time errors and process is continued until said timing error is reduced to below ADC resolution.

4. The method of claim 2/as claimed in claim 2 further comprising a digitally controlled delay element associated with each ADC channel in the array to modify the sampling time in proportion to the said estimated sampling error along with sign from the reference sampling point.

5. The method of claim 1/as claimed in claim 1 wherein the background calibration of time interleaved ADC is performed without interrupting the ADC conversion process.

6. A system for background calibration of time interleaved ADC comprising:
an analog to digital converter (ADC) comprising a plurality of sub ADCs being configured to sample a common input signal and each generating individual digital analog equivalent outputs with sampling time errors;
a skew estimator configured to receive said individual digital analog equivalent outputs with the sampling time errors and to estimate the sampling time errors without requiring any specific restriction on the common input signal, wherein the skew estimator further comprises:
subtractors;
peak detectors;
delay elements configured to align channels data to calculate a digital output proportional to the sampling time errors between two consecutive channels subject to the subtractors and the peak detectors; and
an absolute element without any restriction on ADC channel design; and a digitally controlled delay element configured to receive an output of the skew estimator and also being coupled with the common input signal to change a sampling clock delay to minimize the sampling time errors.

* * * * *